(12) United States Patent
Moussavi

(10) Patent No.: US 8,188,797 B2
(45) Date of Patent: May 29, 2012

(54) ADJUSTABLE ELECTRICAL COMPONENTS FORMED FROM ARRAYS OF DIFFERENTIAL CIRCUIT ELEMENTS

(75) Inventor: Mohsen Moussavi, Kanata (CA)

(73) Assignee: Altera Corporation, San Jose, CA (US)

( * ) Notice: Subject to any disclaimer, the term of this patent is extended or adjusted under 35 U.S.C. 154(b) by 320 days.

(21) Appl. No.: 12/168,811

(22) Filed: Jul. 7, 2008

(65) Prior Publication Data
US 2010/0001784 A1   Jan. 7, 2010

(51) Int. Cl.
*H03K 3/42* (2006.01)
(52) U.S. Cl. .................. 331/36 C; 331/16; 331/167
(58) Field of Classification Search .......... 331/16, 331/36 C, 57, 167
See application file for complete search history.

(56) References Cited

U.S. PATENT DOCUMENTS

| | | | |
|---|---|---|---|
| 6,798,301 B1* | 9/2004 | Balan et al. | 331/74 |
| 6,812,801 B2* | 11/2004 | Korner | 331/158 |
| 2001/0000426 A1 | 4/2001 | Sung et al. | |
| 2005/0195053 A1* | 9/2005 | Uemura | 334/78 |
| 2007/0001775 A1* | 1/2007 | Song | 331/167 |
| 2007/0069831 A1 | 3/2007 | Kwasniewski et al. | |
| 2007/0127616 A1 | 6/2007 | Shumarayev et al. | |
| 2008/0284529 A1* | 11/2008 | Refeld et al. | 331/57 |

OTHER PUBLICATIONS

U.S. Appl. No. 12/111,146, filed Apr. 28, 2008, Xiao et al.
U.S. Appl. No. 12/163,808, filed Jun. 27, 2008, Moussavi et al.
Li et al., "A 2GHz Low Power Differentially Tuned CMOS Monolithic LC2VCO" Chinese Journal of Semiconductors, vol. 27, No. 9, Sep. 2006 pp. 1543-1547.

* cited by examiner

*Primary Examiner* — James E Goodley
(74) *Attorney, Agent, or Firm* — Treyz Law Group; G. Victor Treyz; David C. Kellogg

(57) ABSTRACT

Adjustable circuit components may be formed from arrays of differential circuit elements such as differential capacitors and differential current sources. The differential circuit elements may each have a control input. The differential circuit elements in each array of differential circuit elements may be connected in parallel between first and second terminals. A thermometer code control signal may be provided to the control inputs to adjust the capacitance, current, or other parameter associated with the adjustable circuit component. Adjustable circuit components may also be formed from an array of capacitors or other circuit elements having successively increasing strengths.

24 Claims, 18 Drawing Sheets

| $C_i$ | CAPACITANCE (fF) |
|---|---|
| $C_{100}$ | 51 |
| ⋮ | ⋮ |
| $C_6$ | 4.0 |
| $C_5$ | 3.5 |
| $C_4$ | 3.0 |
| $C_3$ | 2.5 |
| $C_2$ | 2.0 |
| $C_1$ | 1.5 |

FIG. 10

| SN | 0 |
|---|---|
| ⋮ | ⋮ |
| S7 | 0 |
| S6 | 0 |
| S5 | 0 |
| S4 | 0 |
| S3 | 1 |
| S2 | 0 |
| S1 | 0 |

FIG. 11

| SN | 0 |
|---|---|
| ⋮ | ⋮ |
| S7 | 0 |
| S6 | 0 |
| S5 | 1 |
| S4 | 0 |
| S3 | 0 |
| S2 | 0 |
| S1 | 0 |

FIG. 12

| $C_i$ | $C_A$ | $C_B$ |
|---|---|---|
| $C_{100}$ | 1.5 fF | 1.0 fF |
| ⋮ | ⋮ | ⋮ |
| $C_7$ | 1.5 | 1.0 |
| $C_6$ | 1.5 | 1.0 |
| $C_5$ | 1.5 | 1.0 |
| $C_4$ | 1.5 | 1.0 |
| $C_3$ | 1.5 | 1.0 |
| $C_2$ | 1.5 | 1.0 |
| $C_1$ | 1.5 | 1.0 |

FIG. 15

| SN | 0 |
|----|---|
|    | ⋮ |
| S7 | 0 |
| S6 | 0 |
| S5 | 0 |
| S4 | 0 |
| S3 | 1 |
| S2 | 1 |
| S1 | 1 |

FIG. 16

| SN | 0 |
|----|---|
|    | ⋮ |
| S7 | 0 |
| S6 | 0 |
| S5 | 1 |
| S4 | 1 |
| S3 | 1 |
| S2 | 1 |
| S1 | 1 |

FIG. 17 ions. Accurate operation of an adjustable circuit element may be essential to proper operation of a more complex circuit. For example, it may be critical that an adjustable capacitor or current source exhibit a high degree of linearity with respect to its control input. Adjustable circuit elements that are inaccurate may cause the circuitry within which they are embedded to fail.

It would therefore be desirable to be able to provide improved adjustable circuit elements.

ADJUSTABLE ELECTRICAL COMPONENTS FORMED FROM ARRAYS OF DIFFERENTIAL CIRCUIT ELEMENTS

BACKGROUND

This invention relates to adjustable electrical components, and more particularly, to adjustable electrical components formed from arrays of differential circuit elements.

It is often desirable to produce integrated circuits with adjustable circuit components. For example, it may be desirable to product a digitally controlled variable capacitor or a digitally controlled current source. Components such as these may be used to adjust the operation of complex analog and digital circuits.

Accurate operation of an adjustable circuit element may be essential to proper operation of a more complex circuit. For example, it may be critical that an adjustable capacitor or current source exhibit a high degree of linearity with respect to its control input. Adjustable circuit elements that are inaccurate may cause the circuitry within which they are embedded to fail.

It would therefore be desirable to be able to provide improved adjustable circuit elements.

SUMMARY

In accordance with the present invention, adjustable circuit components such as adjustable capacitors and adjustable current sources may be provided. The adjustable circuit components may be formed from arrays of differential circuit elements connected in parallel. The differential circuit elements may be circuit elements such as differential capacitors and differential current sources.

Each differential circuit element may include first and second devices such as first and second capacitors or first and second current sources. The capacitances of the first and second capacitors may be different and the magnitudes of the currents produced by the first and second current sources may be different. Within a given adjustable circuit component, the first devices may have a common value such as a common capacitance or a common current source strength and the second devices may have a common value such as a common capacitance or a common current source strength.

First and second switches in each of the differential circuit elements may be used to selectively switch either the first device or the second device in that element into use. The differential circuit elements may each have a control input at which a control signal is received. An inverter in each differential circuit element may invert the control signal. The control signal may control the first switch and the inverted version of the control signal may control the second switch.

The differential circuit elements in each array of differential circuit elements may be connected in parallel between first and second terminals. A thermometer code control signal may be provided to the control inputs to adjust the capacitance, current, or other parameter associated with the adjustable circuit component.

The adjustable circuit elements may be used to adjust the operation of circuitry such as ring oscillator circuitry and phase-locked loop circuitry.

Further features of the invention, its nature and various advantages will be more apparent from the accompanying drawings and the following detailed description of the preferred embodiments.

BRIEF DESCRIPTION OF THE DRAWINGS

FIG. 10 is a table of illustrative capacitor values that may be used for the capacitors in a capacitor array of the type shown in FIG. 9 in accordance with an embodiment of the present invention.

FIG. 11 is a table showing an illustrative one-hot digital control word for use in controlling a digital capacitor formed from an array of capacitors of the type shown in FIG. 9 in accordance with an embodiment of the present invention.

FIG. 12 is a table showing another illustrative one-hot digital control word for use in controlling a digital capacitor formed from an array of capacitors of the type shown in FIG. 9 in accordance with an embodiment of the present invention.

FIG. 15 is a table of illustrative capacitor values that may be used for the capacitors in an array of delta capacitors in accordance with an embodiment of the present invention.

FIG. 16 is a table showing an illustrative thermometer code digital control word for use in controlling a digital capacitor formed from an array of delta capacitors in accordance with an embodiment of the present invention.

FIG. 17 is a table showing another illustrative thermometer code digital control word for use in controlling a digital capacitor formed from an array of delta capacitors in accordance with an embodiment of the present invention.

DETAILED DESCRIPTION

The present invention relates to adjustable circuit components such as adjustable capacitors and adjustable current sources. Each adjustable circuit component may be formed from an array of circuit elements. The circuit elements may be differential capacitors (sometimes referred to as delta capacitors), differential current sources, or other differential elements.

Adjustable circuit components in accordance with the invention may be used in adjustable circuitry on an integrated circuit. Integrated circuits in which the adjustable circuitry is used include programmable logic device integrated circuits, microprocessors, logic circuits, analog circuits, application specific integrated circuits, memory, digital signal processors, analog-to-digital and digital-to-analog converter circuits, etc. The adjustable circuitry may include a digitally control oscillator (as an example). A digitally controlled oscillator may be used in generating a clock signal or any other suitable signal. Oscillators may be used as part of a phase-locked loop circuit, delay-locked loop, or any other suitable circuitry.

Digitally controlled oscillators may be based on an architecture in which multiple inverters are connected in a ring. The inverters may be single-ended inverters or may be differential inverters. Digitally controlled adjustable capacitors may be used as adjustable loads at the outputs of the inverters.

Figure 1:
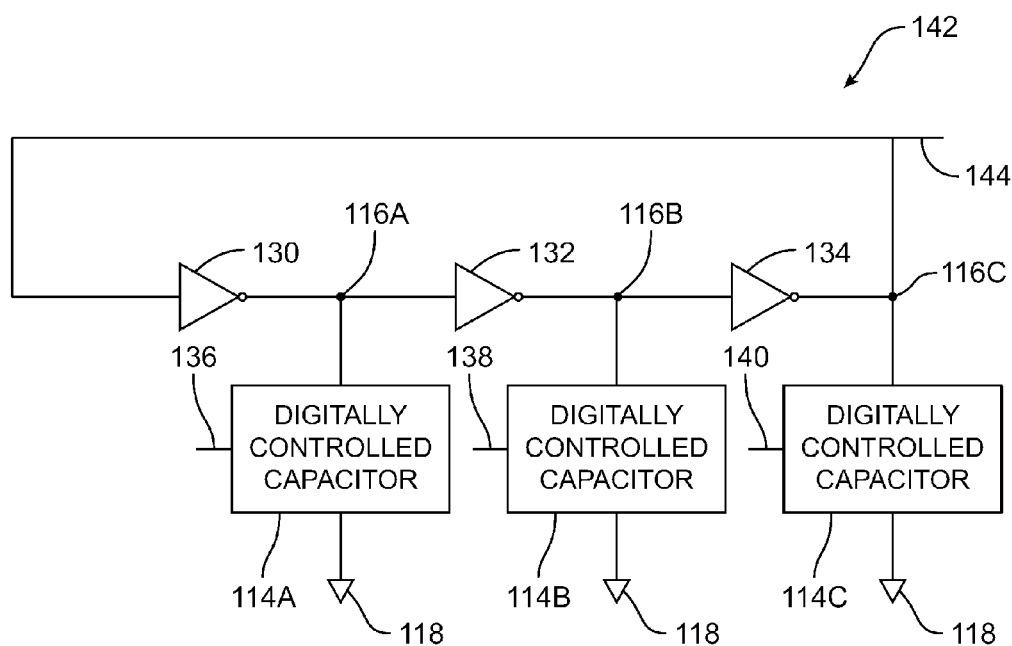
FIG. 1 is a diagram of an illustrative digitally controlled oscillator based on a loop of single-ended inverters and digitally controlled capacitors in accordance with an embodiment of the present invention.

Adjustable oscillator circuitry that includes adjustable circuit components such as adjustable capacitors is shown in FIG. 1. The oscillator arrangement of FIG. 1 includes a ring oscillator 142 that is based on single-ended inverters. In the example of FIG. 1, there are three single-ended inverters in ring oscillator 142. This is merely illustrative. Ring oscillators such as ring oscillator 142 may have any suitable number of inverters. In a typical arrangement, a ring oscillator based on single-ended inverters may have an odd number of inverter stages, as this ensures that the ring oscillator will not enter an undesirable stable latched state.

As shown in FIG. 1, ring oscillator 142 may have a first inverter 130, a second inverter 132, and a third inverter 134. The output of inverter 130 is connected to node 116A and forms a first of the two terminals for digitally controlled capacitor 114A. Ground terminal 118 may form the other of the two capacitor terminals for digitally controlled capacitor 114A. Inverters 132 and 134 may have their outputs connected to nodes 116B and 116C, respectively. Digitally controlled capacitor 114B is connected between node 116B and a ground node such a node 118. Digitally controlled capacitor 114c is connected between terminal 116C and terminal 118.

Each of the digitally controlled capacitors 114A, 114B, and 114C may be based on a corresponding array of differential capacitors (sometimes referred to as delta capacitors). Digitally controlled capacitor 114A may be controlled by a digital control word (code) supplied to control input 136. Digitally controlled capacitors 114B and 114C may be controlled by digital control signals provided respectively to control inputs 138 and 140. The digital control signals that are applied to inputs 136, 138, and 140 may all be the same or some or all of these control signals may be different from each other. Inputs such as inputs 136, 138, and 140 generally each include multiple lines, each of which is used to convey a respective bit of a digital control word.

Figure 2:
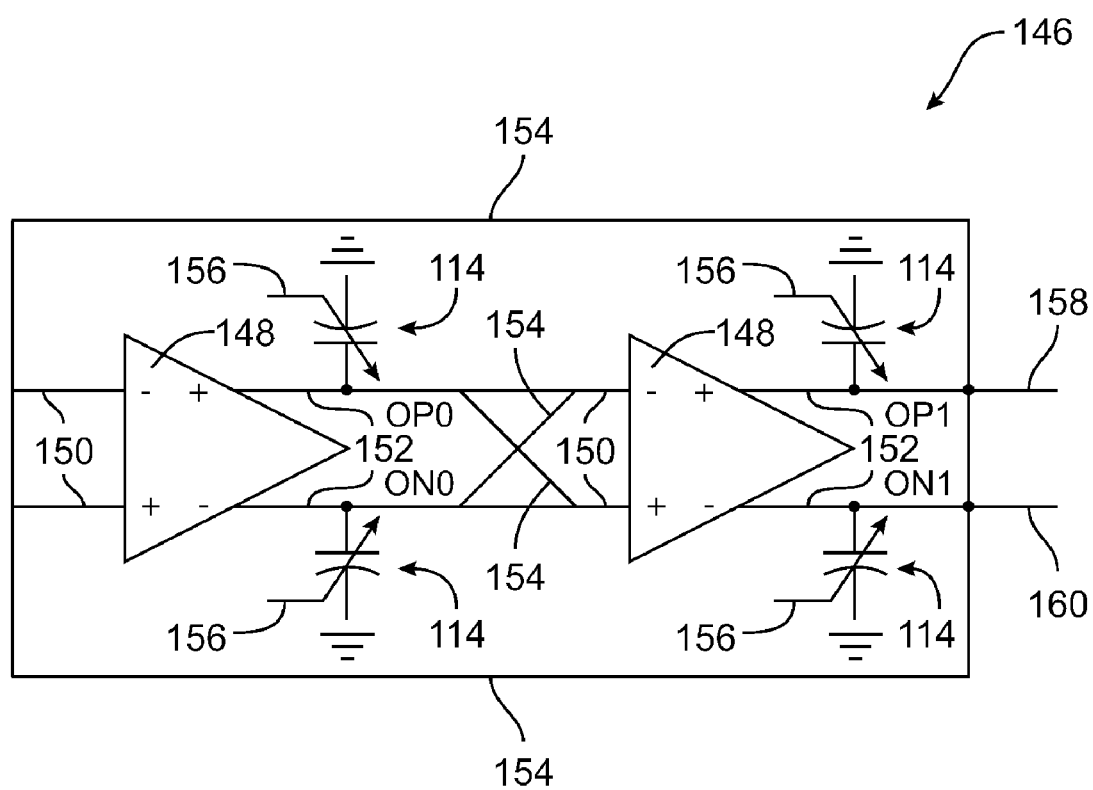
FIG. 2 is a diagram of an illustrative digitally controlled oscillator based on a loop of differential inverters and digitally controlled capacitors in accordance with an embodiment of the present invention.

In the illustrative arrangement of FIG. 1, ring oscillator 142 is formed from a series of single-ended inverters. If desired, a ring oscillator may be formed using differential inverters. An illustrative ring oscillator of this type is shown in FIG. 2. As shown in FIG. 2, ring oscillator 146 may be formed from differential inverters 148. Ring oscillators formed from differential inverters may have an even number of inverters. In the FIG. 2 example, ring oscillator 146 has two differential inverters 148. If desired, a ring oscillator based on differential inverters may have more than two differential inverters. An advantage to using an even number of inverters in a ring oscillator is that this produces output signals with a 50% duty cycle. Signals with a 50% duty cycle may be used as clocks (as an example). Differential inverter schemes may also exhibit reduced noise sensitivity.

The differential inverters 148 each have two inputs 150 (i.e., a positive and a negative input) and two outputs 152 (i.e., a positive and a negative output). These outputs feed nodes that are labeled OP0 (positive output 0), ON0 (negative output 0), OP1 (positive output 1), and ON1 (negative output 1) in FIG. 2. In one of the sets of paths between the inverters, the lines are cross-coupled, so that OP0 and ON0 are respectively connected to the positive and negative inputs of the second inverter of FIG. 2, whereas OP1 and ON1 are respectively connected to the negative and positive inputs of the first inverter of FIG. 2. In this type of arrangement, the inverters do not form a stable latch-type circuit, thereby ensuring oscillation. The signals on any of the nodes may be used as output signals. For example, the signals on lines such lines 158 and 160 may be used as outputs.

Each of the differential inverter output nodes in ring oscillator 146 may have a respective digitally controlled capacitor 114. Each capacitor may be controlled by a potentially independent digital control word on its control path 156. Each capacitor 114 of ring oscillator 146 may be formed from multiple parallel digitally controlled capacitors arranged in an array. There may be any suitable number of capacitors in this type of array (e.g., tens, hundreds, thousands, or more). Each adjustable capacitor 114 in an arrangement of the type shown in FIG. 2 or an arrangement of the type shown in FIG. 1 (e.g., for capacitors 114A, 114B, and 114C) typically contains the same number of capacitors and uses the same type of control scheme for those capacitors, although arrangements with different number of capacitors and different mixtures of control schemes may be used if desired.

The digital control words that are applied to the control inputs 156 of capacitors 114 of FIG. 2 and control inputs 136 of capacitors 114A, 114B, and 114C of FIG. 1 may be supplied from any suitable source. For example, some or all of these signals may be produced by on-chip circuitry. Some or all of these signals may also be received from an external source. All or part of the digital control words may include or may be based on dynamic control signals. If desired, all or part of the digital control words may include or be based on static control signals that are supplied at the outputs of programmable elements or are derived from such outputs. The programmable elements may be based on electrically programmed memory elements such as electrically programmable read only memory, electrically programmed fuses or antifuses, laser programmed fuses or antifuses, programmable registers, or any other suitable programmable components.

Static and dynamic control signals for the digital control words may be applied directly to the control inputs of the digitally controlled capacitors or some or all of these signals may first be processed by on-chip circuitry such as a decoder circuit. A decoder circuit may receive undecoded (binary) signals at an input. The undecoded signals may include static control signals, dynamic control signals, static and dynamic control signals from external sources, static and dynamic control signals from internal sources (e.g., dynamic control circuitry or programmable elements that have been loaded with appropriate settings data), etc. A corresponding digital control word may be produced at the output of the decoder. The individual signals in the digital control word may have, for example, values that range from digital low values Vss of 0 volts to digital high values Vdd of, for example, 1.1 volts (as an example). Each of these voltages may be applied to the control input of a capacitor in an adjustable capacitor array.

Ring oscillators formed form digitally controlled capacitors may be used in any suitable circuitry on an integrated circuit. As an example, ring oscillators of this type may be used as digitally controlled oscillators in digital phase-locked loops.

Figure 3:
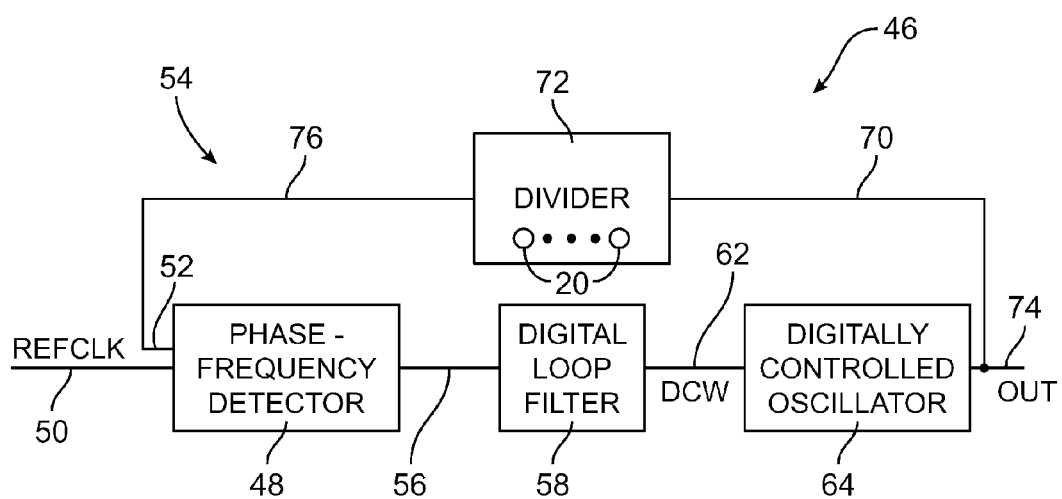
FIG. 3 is a diagram of an illustrative digital phase-locked loop that may use a digitally controlled oscillator with digitally controlled capacitors in accordance with an embodiment of the present invention.

An illustrative digital phase-locked loop circuit in accordance with an embodiment of the present invention is shown in FIG. 3. As shown in FIG. 3, phase-locked-loop circuit 46 may have a phase-frequency detector 48. Phase-frequency detector 48 of digital phase-locked loop circuit 46 may receive a reference clock signal REFCLK or other input signal at input 50. Phase-frequency detector 48 also receives a feedback signal from feedback path 54 at input 52. Phase-frequency detector 48 compares the signals on lines 50 and 52 and generates a corresponding error control signal on path 56 for digital loop filter 58. The error signal directs filter circuitry 58 to generate a digital control word DCW on output path 60. The signal DCW may be provided in any suitable coding format such as binary, thermometer code, one-hot code, or a mixture of such codes.

There may be any suitable number of conductive lines in path 62. For example, there may be tens or hundreds of lines in path 62. The digital control signal DCW on path 62 may be received by the input of digitally controlled oscillator 64. Optional decoder circuitry may be interposed in this path if desired. Within circuit 64, the digital control word or portions of the digital control word signal may be routed in parallel or separately to respective adjustable capacitors 114.

The output signal OUT on output 74 of digital phase-locked loop circuit 46 may be used as a clock signal or other signal on an integrated circuit. Integrated circuits that may include circuitry such as circuitry 46 of FIG. 3 include memory chips, digital signal processing circuits, microprocessors, application specific integrated circuits, programmable logic device integrated circuits, analog-to-digital converter circuits, or any other suitable integrated circuits.

Digitally controlled oscillator 64 may be based on a single-ended inverter architecture of the type described in connection with FIG. 1 or a differential inverter architecture of the type described in connection with FIG. 2. The digital control signal DCW on path 62 may be supplied to the control inputs of digitally controlled capacitors in the ring oscillator. The frequency of the output of digitally controlled oscillator 64 is therefore determined by the value of the digital control signal DCW that is received via input path 62.

Path 70 may be used to feed back the signal OUT from digitally controlled oscillator 64 to divider 72. Divider 72 may divide the signal OUT by an appropriate integer N (e.g., by one, by two, by more than two, etc.). If desired, the value of N may be adjusted using dynamic control signals or static control signals from programmable elements 20. The divided output of divider 72 may be provided to input 52 over line 76 in feedback path 54.

The amount by which divider 72 divides signal OUT determines the ratio between the frequency of REFCLK (or other input signal at input 50) and the frequency of output signal OUT on output path 74. For example, input IN may receive a reference clock signal at a given frequency and input OUT may provide a locked output clock signal at a frequency of N times the given frequency. In a typical scenario, the frequency of REFCLK might be 100 MHz and the frequency of OUT might be 400 MHz (as an example).

The adjustable capacitors 114 (including capacitors 114A, 114B, and 114C of FIG. 1) in circuits such as digitally controlled oscillator 64 can each be formed from an array of capacitors. Switches such as transistor-based switches may be used to selectively switch certain capacitors in the array into use. The overall capacitance of the array (i.e., the capacitance of the adjustable capacitor formed from the array of capacitors) may be adjusted by controlling which capacitors in the array are used.

Any suitable capacitors may be used to form an array of capacitors for an adjustable capacitor. For example, capacitors may be formed from p-n junctions, metal-oxide-semiconductor transistor structures, metal-oxide-metal (metal-insulator-metal) structures, etc.

Figure 4:
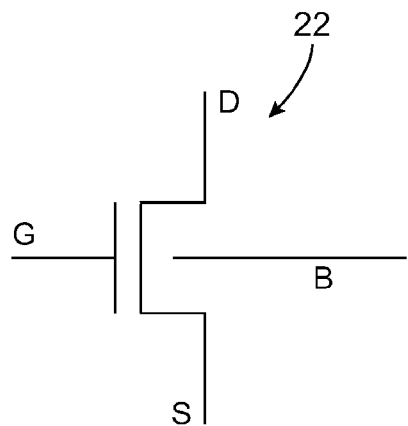
FIG. 4 is a diagram of an n-channel metal-oxide-semiconductor transistor in accordance with an embodiment of the present invention.

With one suitable arrangement, the capacitors in the array are formed from metal-oxide-semiconductor (MOS) structures. Capacitors of this type may be formed from structures that are otherwise used on an integrated circuit to form a metal-oxide-semiconductor transistor. These transistors have four terminals—a source, a drain, a gate, and a body. The source and drain terminals of metal-oxide-semiconductor transistors are sometimes referred to collectively as source-drain terminals or source-drains. A schematic diagram of an illustrative n-channel metal-oxide-semiconductor transistor 22 is shown in FIG. 4. The source of transistor 22 is labeled S, the drain is labeled D, the gate is labeled G, and the body is labeled B. Source S and drain D are source-drains.

Figure 5:
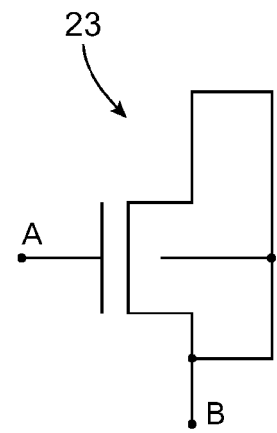
FIG. 5 is a diagram of a capacitor formed from an n-channel metal-oxide-semiconductor transistor in accordance with an embodiment of the present invention.
Figure 6:
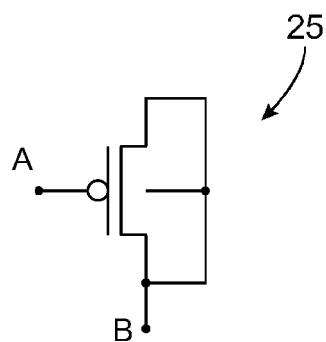
FIG. 6 is a diagram of a capacitor formed from a p-channel metal-oxide-semiconductor transistor in accordance with an embodiment of the present invention.
Figure 7:
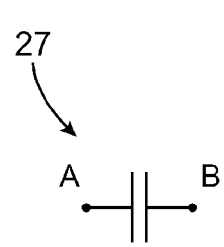
FIG. 7 is a diagram of a capacitor formed from an n-channel or p-channel metal-oxide-semiconductor transistor in accordance with an embodiment of the present invention.

When the drain, source, and body terminals of a metal-oxide-semiconductor transistor such as transistor 22 of FIG. 4 are shorted together, the transistor forms a metal-oxide-semiconductor capacitor. A capacitor 23 that is based on an n-channel metal-oxide-semiconductor transistor is shown in FIG. 5. The two terminals of the capacitor are labeled A and B. A capacitor 25 that is formed from a p-channel metal-oxide-semiconductor transistor is shown in FIG. 6. Transistor-based capacitors such as capacitor 23 of FIG. 5 and capacitor 25 of FIG. 6 are represented schematically as capacitor 27 of FIG. 7.

In a given circuit, a metal-oxide-semiconductor capacitor can be formed using an n-channel or a p-channel transistor. In general, a circuit designer will use whichever transistor structure produces the largest capacitance for a given area.

Figure 8:
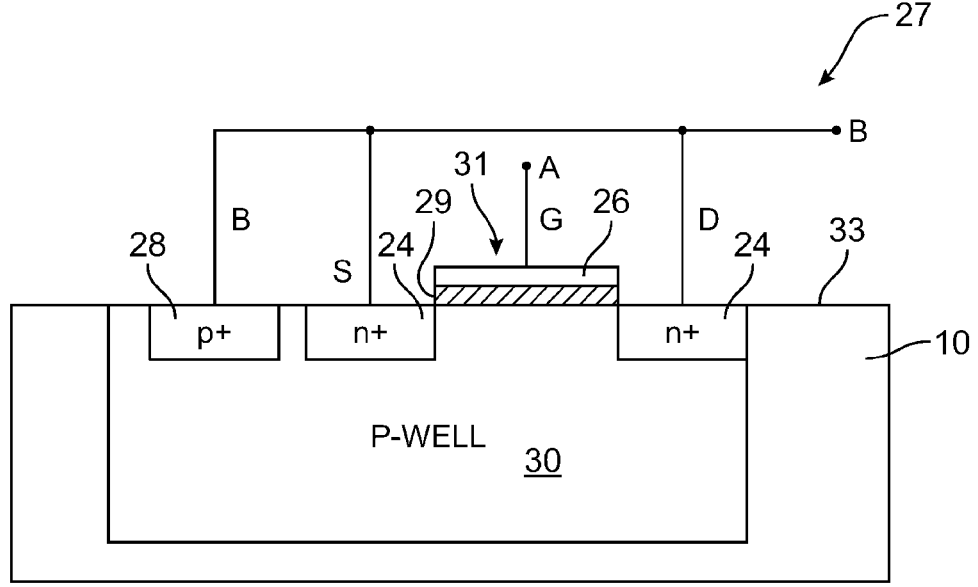
FIG. 8 is a cross-sectional side view of an illustrative integrated circuit capacitor formed from an n-channel metal-oxide-semiconductor transistor in accordance with an embodiment of the present invention.

A cross-sectional side view of capacitor 27 when formed using the n-channel arrangement of capacitor 23 of FIG. 5 is shown in FIG. 8. Source S and drain D are formed using implant regions 24 in the surface 33 of integrated circuit 10. Gate structure 31 is formed from a thin layer of insulator 29 such as silicon oxide and a gate conductor 26 such as silicided polysilicon. Because the insulator 29 is typically formed using at least some silicon oxide, insulator 29 is typically referred to as the gate "oxide," regardless of its exact composition. Body terminal B uses implant region 28 to form an ohmic contact with p-type body region 30.

Transistor capacitors such as capacitor 27 produce a certain amount of capacitance for each unit of gate surface area. If the lateral dimensions (length and width) of gate structure 31 are large, gate structure 31 will consume a large amount of real estate on the surface 33 of the integrated circuit. As a result, the capacitance of the capacitor formed with such a gate structure will also be large. Capacitance also scales with oxide thickness. If oxide 29 is thin, the capacitance per unit of surface area will be high, whereas capacitance per unit of surface area will be low if oxide 29 is thick. Adjustments to the area and insulator thickness in a capacitor can therefore be used to make capacitance adjustments.

Figure 9:
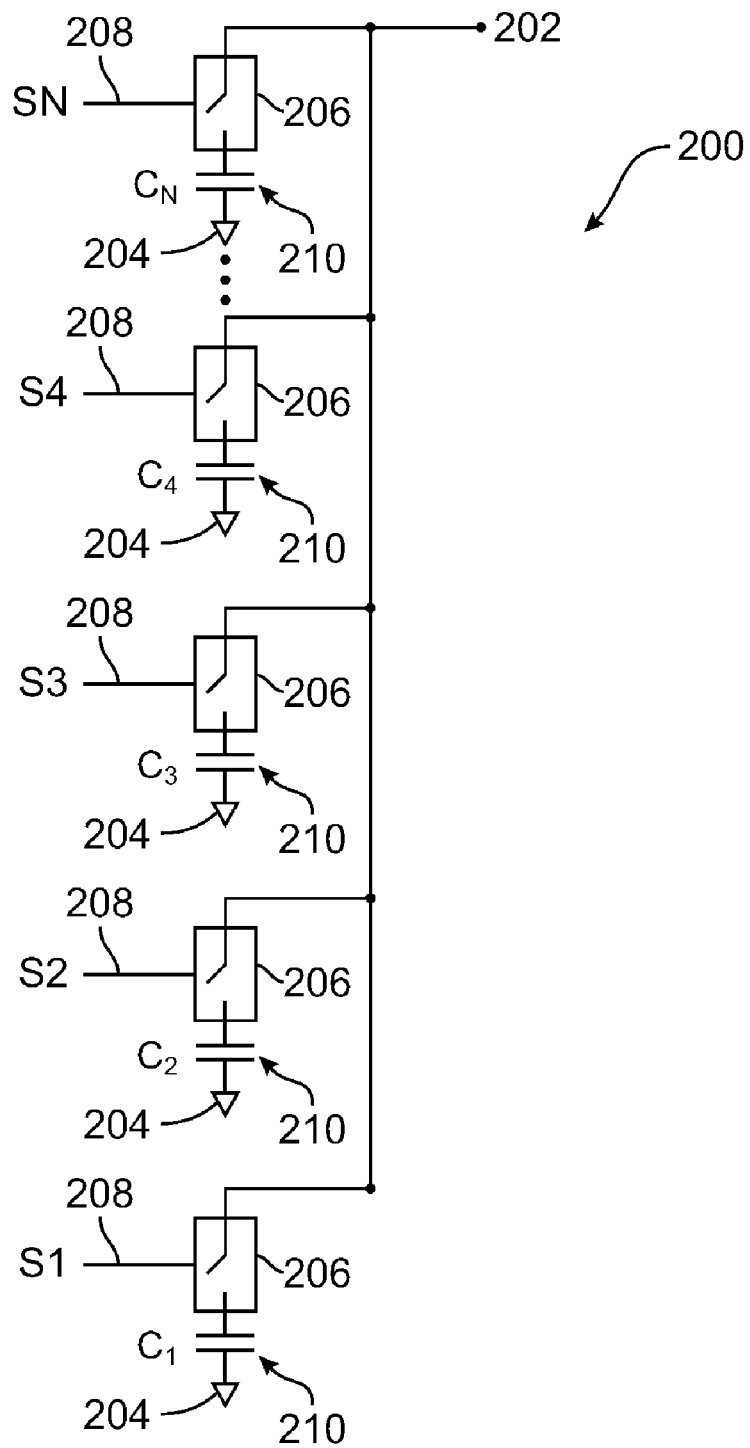
FIG. 9 is a diagram of an adjustable capacitor based on an array of individually selectable capacitors of increasing value in accordance with an embodiment of the present invention.

An array of capacitors such as capacitor 27 may be used to form an adjustable capacitor. An illustrative adjustable capacitor 200 that has been formed from an array of capacitors 210 is shown in FIG. 9. Each capacitor 210 in the FIG. 9 example may be a MOS capacitor such as capacitor 27 of FIG. 7.

Adjustable capacitors in accordance with the invention that are of the type shown in FIG. 9 are sometimes referred to as using a "delta capacitor" arrangement. With this type of arrangement, an adjustable amount of capacitance may be produced between two terminals by controlling which capacitors are switched into use. In this example, a first capacitor terminal of capacitor 200 is represented by capacitor terminal 202. A second capacitor terminal of capacitor 200 is represented by ground terminal 204. If desired, the second capacitor terminal in capacitor 200 may be connected to other nodes. The arrangement of FIG. 9 in which the second terminal is grounded is merely illustrative.

Switches such as switches 206 may be used to selectively switch capacitors 210 in to use. Switches 206 may be implemented using transistors (e.g., n-channel or p-channel metal-oxide-semiconductor transistors, complementary metal-oxide-semiconductor pass gates, multiple transistors of these types, or other suitable switch circuits). Each switch 206 may be controlled by a control signal at a respective input 208. The voltage that is presented to each input 208 is generally a digital value. If the digital value is a logic high (e.g., a positive power supply voltage Vdd of 0.8-1.2 volts), the corresponding switch 206 will have a first state (e.g., it will be turned on). If the digital value is a logic low (e.g., a ground voltage Vss of 0 volts), the switch 206 that is receiving that digital value at its control input 208 will be placed in a second state (e.g., it will be turned off). When a given switch 206 is off, there will be an open circuit between its terminals. This open circuit will disconnect the capacitor 210 that is connected to that switch 206 from node 202. When a given switch 206 is on, there will be a closed circuit between its terminals that electrically connects the capacitor 210 for that switch 206 to terminal 202.

The control signals in the FIG. 9 example have been labeled S1, S2, S3, . . . SN and may be considered to make up a digital control word S. This digital control signal may sometimes be referred to as DCW, as in FIG. 3. The capacitors 210 in capacitor 200 have been labeled C1, C2, C3, . . . CN.

The format that is used for digital control word S depends on the type of capacitor array that is being used to form the adjustable capacitor. In the FIG. 9 example, adjustable capacitor 200 is being formed from capacitors 210 that each have a slightly different value. The capacitor 210 that is associated with control bit S1 (i.e., capacitor C1) is generally fabricated with a relatively low capacitance. This capacitance value may be, for example, the minimum capacitance that may be formed by a MOS capacitor that has been fabricated according to the design rules of the integrated circuit manufacturing process. The capacitor associated with control signal S2 (i.e., capacitor C2) is then fabricated with a slightly higher capacitance. Each successive capacitor in the array (i.e., capacitors C3, C4, . . . CN) may be provided with an incrementally larger capacitance value in this way.

When it is desired to tune the overall capacitance of adjustable capacitor 200, a selected one of the control signals S1, . . . SN is taken high, while the remaining control signal bits are held low. Because only one of the control bits in control signal S is taken high at a given time, this type of scheme is sometimes referred to as a one-hot encoding scheme.

The sizes used for the capacitors 210 in array 200 may be selected to produce a desired step size between successive capacitors. The difference in capacitance between successive capacitors 210 is limited by the resolution of the semiconductor fabrication process that is used in fabricating capacitors 210, not by the minimum design rules for that fabrication process. Because fabrication resolution can be relatively high, the step size (i.e., C2−C1) can be smaller than the minimum capacitance value that could be fabricated in a single capacitor structure (i.e., C1). Capacitor arrays such as array 200 may therefore be used to provide adjustable capacitors with a high resolution.

The total number of capacitance steps in a given adjustable capacitor and the step size may be selected by a circuit designer to cover a desired capacitance tuning range with a desired resolution. There may be, for example, tens, hundreds, or thousands of individual capacitors in the capacitor array. The use of smaller capacitance steps increases resolution. The use of larger numbers of capacitors (for a given step size) increases the tuning range.

As an example, capacitor 200 may have 100 individual capacitors 210. A table showing illustrative capacitance values for each of these capacitors is shown in FIG. 10. In the FIG. 10 example, capacitor C1 has a capacitance of 1.5 fF. Each successive capacitor has 0.5 fF of additional capacitance (i.e., capacitor C2 has a capacitance of 2.0 fF, capacitor C3 has a capacitance of 2.5 fF, etc.). In this type of scenario, the step size between each pair of successive capacitors (i.e., $C_{i+1}-C_i$) is 0.5 fF. This step size may be smaller (as an example) than the minimum possible MOS capacitor size according to semiconductor fabrication design rules (which might be, as an example, 1 fF or 1.5 fF).

When selecting a desired capacitance for capacitor 200, a suitable digital control word S may be applied to control inputs 208 using a one-hot format. As an example, consider the tables of FIGS. 11 and 12, which show illustrative control words S. In the FIG. 11 example, all of the control bits on inputs 208 are low except the control bit S3 that is associated with capacitor C3. In this type of situation, the capacitance of adjustable capacitor 200 will be C3, because all of the switches 206 in capacitor 200 will be open except for the switch 206 that is associated with capacitor C3. If it is desired to increase the capacitance of capacitor 200 by two capacitance steps (i.e., by 1.0 fF in this example), the digital control word may be adjusted to produce the configuration of FIG. 12. In the FIG. 12 example, signal S5 is high and the other control bits in digital control word S are low. This turns on the switch 206 that is associated with capacitor C5, so the capacitance measured across nodes 202 and 204 will be C5. Capacitor C5 is two capacitance steps larger than capacitor C3, so changing the control signal S from the configuration shown in FIG. 11 to the configuration shown in FIG. 12 will result in two increments in the capacitance of capacitor 200.

Arrangements of the type shown in FIG. 9 may be advantageous in circuit designs in which it is desired to minimize the number of switches 206 in a given capacitor array. In certain scenarios, however, fabrication variations may be detrimental to the proper operation of arrays of this type. This is because the amount of capacitance variation in a given capacitor 210 tends to scale with the square root of capacitor size. Consider, as an example, a situation in which process variations cause capacitor variations on the order of 0.02 fF for capacitor C1. Capacitance fluctuations due to process variations are statistical in nature. In this example, fluctuations of 0.02 fF correspond to one standard deviation ($\sigma$) in a distribution of possible fluctuations. Because fluctuation magnitudes vary as the square root of capacitor magnitude, capacitors such as capacitor C100 in the example of FIG. 10 will exhibit fluctuations on the order of 0.14 fF (corresponding to one standard deviation). For any two successive capacitors near the largest values in array 200 (i.e., capacitors C99 and C100), the expected fluctuation between the capacitors is multiplied by the square root of 2 (i.e., for one standard deviation, the expected fluctuation between C99 and C100 is 1.4*0.14 fF=0.2 fF).

Many design specifications require compliance with a so-called three sigma requirement. When manufacturing this type of integrated circuit, component variations up to three standard deviations must be tolerated. In the present example, variations in the magnitude of the capacitance of the capacitors in array 200 up to 3*0.2 fF (i.e., up to 0.6 fF) would need to be tolerated. However, if the capacitance of capacitors C99 and C100 vary relative to each other by this much, capacitor C100 may have a capacitance that is 0.1 fF less than capacitor C99 (i.e., because the 0.5 fF step size has been overwhelmed by the 0.6 fF manufacturing variations). In this situation, the capacitances of capacitors 210 will not be monotonically increasing, which can lead to performance issues for circuits in which capacitor 200 is used. This type of manufacturing-induced error can be avoided by using designs with larger step sizes between successive capacitors 210 and by using a smaller total number of capacitors in array 200.

Figure 13:
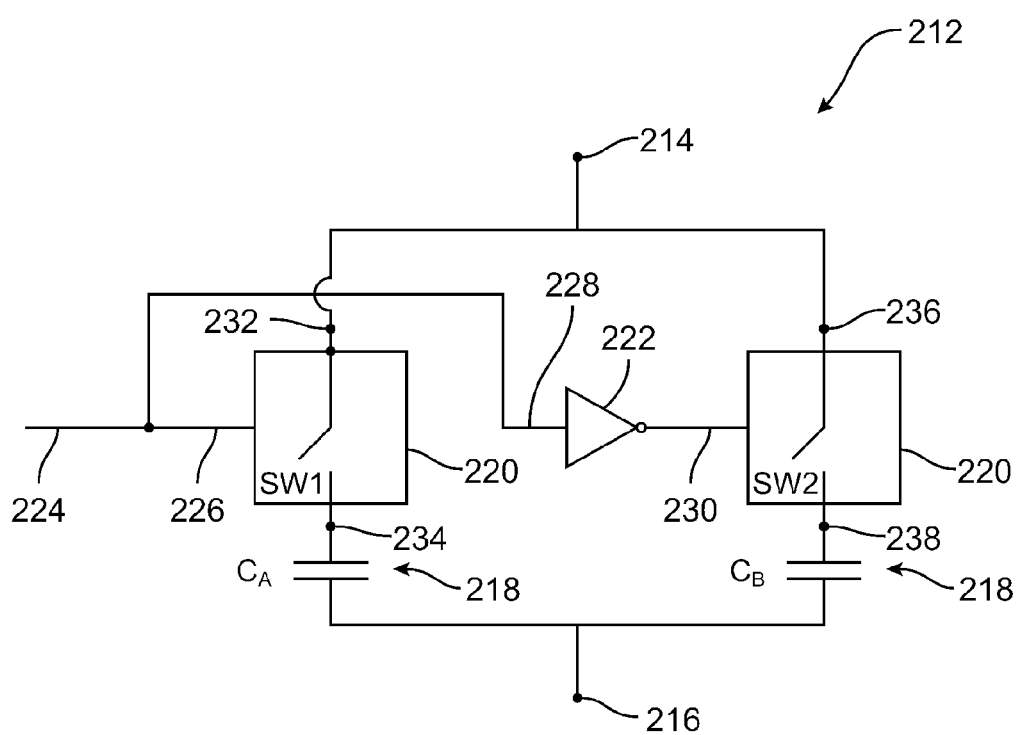
FIG. 13 is a diagram of an illustrative delta capacitor in accordance with an embodiment of the present invention.

Another way to address potential performance issues involves the use of differential capacitors for each of the capacitors in the array. An illustrative differential capacitor is shown in FIG. 13. Differential capacitors such as differential capacitor 212 of FIG. 13 are sometimes referred to as delta capacitors. As shown in FIG. 13, differential capacitor 212 may have two capacitors 218. Each of these capacitors has a different capacitance. The capacitance of the first of capacitors 218 is $C_A$. The capacitance of the second of capacitors 218 is $C_B$.

Switches 220 may be controlled so that either the first or the second of capacitors 218 is electrically connected between capacitor terminals 214 and 216. Each switch 220 (which may be implemented using one or more transistors or other suitable switch circuit) may be controlled by control signals at its input. Switch SW1 may be controlled by control signals received at input 226. Switch SW2 may be controlled by control signals received at input 230. Differential capacitor 212 may have an associated control input such as control input 224. Control input 224 may be connected to input 226 of switch SW1 and input 228 of inverter 222. Inverter 222 may invert the signals presented on input 228 and may provide corresponding inverted versions of these signals on its output. The output of inverter 222 may be connected to control input 230 of switch SW2.

The signal at differential capacitor control input 224 may be a digital signal that has either a logic high or a logic low value. Switches 220 may have one state (e.g., closed) when their control input is high and may have another state (e.g., open) when their control input is high. Because of the presence of inverter 222, the control signal for switch SW2 will be high when the control signal for SW1 is low and vice versa. With this type of arrangement, switch SW1 is closed when switch SW2 is open and switch SW1 is open when switch SW2 is closed.

Because capacitors $C_A$ and $C_B$ have different values, the capacitance of capacitor 212 may be adjusted by taking the control signal on control input 224 high or low. When it is desired to switch the larger of capacitors 218 into use (e.g., capacitor $C_A$), the control signal on input line 224 and therefore the control signal on input 226 may be taken high. Inverter 222 inverts the control signal on line 224 so that the control signal on line 230 is low. When the control signal on line 226 is high and the control signal on line 230 is low, switch SW1 will be closed and switch SW2 will be open. As a result, switch terminal 232 will be electrically connected to switch terminal 234 and capacitor $C_A$ will be switched into use between differential capacitor terminals 214 and 216. When it is desired to switch the smaller of capacitors 218 into use (e.g., capacitor $C_B$), the control signal on input line 224 may be taken low. With the signal on line 224 low, the signal on line 226 will be low and the signal on line 230 will be high. Switch SW1 will therefore be open, disconnecting capacitor $C_A$ from the circuit, while switch SW2 will be closed, shorting node 236 to node 238 and switching capacitor $C_B$ into use. With nodes 236 and 238 shorted to each other, capacitor $C_B$ will be electrically connected between capacitor terminals 214 and 216.

Adjustment of the control signal on line 224 therefore adjusts the capacitance of differential capacitor 212 between its high value $C_A$ and its low value $C_B$. A small step size may be achieved by manufacturing capacitors $C_A$ and $C_B$ so that the magnitudes of their capacitances differ by a small amount. As an example, a capacitance step size of 0.5 fF may be achieved by constructing $C_A$ and $C_B$ so that $C_A$ is 0.5 fF greater than $C_B$. Small step sizes may be provided because the minimum magnitude for the capacitance step size is limited by manufacturing process resolution, rather than the minimum component sizes permitted by fabrication design rules.

Because the amount by which the capacitance of each capacitor varies due to manufacturing variations scales with capacitance size and because the real estate consumed by capacitors 218 increases with increasing capacitance, it is generally desirable to fabricate capacitors 218 so that they have relatively small capacitances. For example, if semiconductor fabrication process design rules dictate that the minimum possible capacitance of a capacitor on an integrated circuit will be 1 fF, it may be desirable to fabricate capacitor $C_B$ with a capacitance of 1 fF. The capacitance of capacitor $C_A$ can be selected to adjust the capacitance step size that is desired for capacitor 212. For example, if it is desired for capacitor 212 to exhibit a tuning range of 0.5 fF, capacitor $C_A$ can be provided with a capacitance of 1.5 fF. In this configuration, the capacitance of capacitor 212 may be adjusted between 1.5 fF (when $C_A$ is switched into use) and 1.0 fF (when $C_B$ is switched into use).

Figure 14:
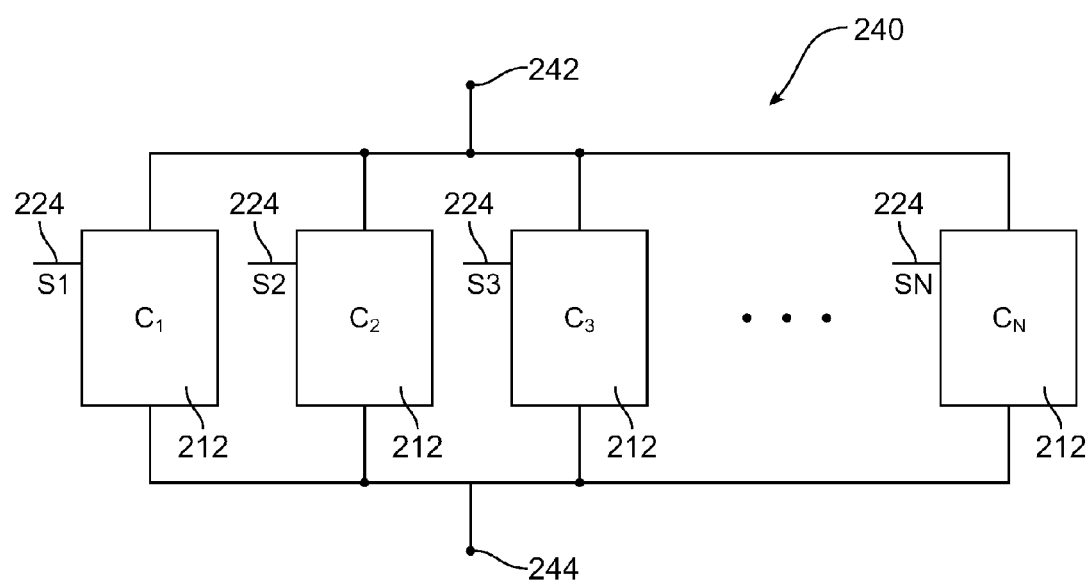
FIG. 14 is a diagram of an illustrative adjustable capacitor formed from an array of delta capacitors of the type shown in FIG. 13 in accordance with an embodiment of the present invention.

An adjustable capacitor may be formed by constructing an array of differential capacitors of the type shown in FIG. 13. This type of arrangement is shown in FIG. 14. As shown in FIG. 14, adjustable capacitor 240 may have first terminal 242 and second terminal 244. Differential capacitors 212 such as the differential capacitor of FIG. 13 may be connected in parallel between capacitor terminals 242 and 244. Each capacitor 212 may have a respective control terminal 224 that receives an associated digital control signal. These control signals may be high or low. When a control bit on a line 224 of capacitor 240 is high, the capacitance of the capacitor 212 that is associated with that control signal will be $C_A$. When this control bit is low, the capacitance of the capacitor 212 will be $C_B$. The maximum capacitance for capacitor 240 will be achieved when all of control lines 224 are high. The minimum capacitance for capacitor 249 will be achieved when all control lines are low. When some of the control lines 224 are high and some are low, a capacitance of an intermediate value will be produced between terminals 242 and 244. As shown in FIG. 14, the control signals on lines 224 may be labeled S1, S2, S3, ... SN and may collectively form a digital control word S (also sometimes referred to as digital control word DCW).

The capacitors 212 in array 240 that are controlled by digital control signal S are labeled C1, C2, C3, ... CN in FIG. 14. There may be any suitable number of differential capacitors 212 in array and any suitable format may be used for control signal S. With one illustrative configuration, adjustable capacitor 240 may be formed from an array of 100 differential capacitors 212. As shown in FIG. 15, each differential capacitor 212 may be formed using the same set of capacitors $C_A$ and $C_B$. For example, each of capacitors 212 may have a capacitor $C_A$ with a capacitance of 1.5 fF and each of capacitors 212 may have a capacitor $C_B$ with a capacitance of 1.0 fF. It may be desirable to form capacitors 218 (i.e., capacitors $C_A$ and $C_B$) from structures exhibiting relatively low capacitances, because this may help to reduce the impact of manufacturing variations.

The control signal S that is provided on control inputs 224 of capacitors 212 may be encoded using any suitable format. As an example, the control signal S may be provided in thermometer code. As with binary code signals and control signals in one-hot code, thermometer code signals contain digital bits. However, in a thermometer code signal S, the number of digital high values (i.e., the number of digital ones) is indicative of the strength of the control signal. As an example, an eight bit thermometer code signal might range in value from 11111111 (its maximum value) to 00000000 (its minimum value). The signal 00000001 has a strength of one, the signal 00000011 has a strength of two, the signal 00000111 has a strength of three, etc. (The high signals in a thermometer code signal are contiguous, which makes thermometer code data take on the appearance of the fluid in a thermometer.)

Illustrative thermometer-code control signals S that may be used in controlling capacitor 240 are shown in FIGS. 16 and 17.

In the example of FIG. 16, the control bits that make up digital control word S are all zero except for S1, S2, and S3, which are one. In this situation, capacitors C1, C2, and C3 each have a capacitance of $C_A$ (i.e., 1.5 fF), whereas capacitors C4, C5, ... C100 have a capacitance of $C_B$ (i.e., 1.0 fF). Each capacitor 212 that is producing $C_A$ instead of $C_B$ contributes an extra 0.5 fF of capacitance. The control signal S of FIG. 16 has therefore adjusted the capacitance of capacitor 240 so that it is 1.5 fF (three steps) more than its minimum possible value.

In the FIG. 17 example, the control bits that make up digital control word S are all zero except for S1, S2, S3, S4, and S5 bits, which are one. In this situation, capacitors C1, C2, C3, C4, and C5 each have a capacitance of $C_A$ (i.e., 1.5 fF), whereas capacitors C6, C7, ... C100 have a capacitance of $C_B$ (i.e., 1.0 fF). The control signal S of FIG. 17 has therefore adjusted the capacitance of capacitor 240 so that it is 2.5 fF (5 steps) more than its minimum possible value. As this example demonstrates, the thermometer code signal S may be adjusted to select how many capacitance steps (of 1.5 fF-1.0 fF in this example) are switched into use between capacitor terminals 242 and 244 of capacitor 240 (FIG. 14). When the strength of the digital control word S is low, the capacitance of capacitor 240 is low. When the strength of the digital control word S is increased, the capacitance of capacitor 240 is increased by a corresponding amount.

An advantage of an adjustable capacitor of the type shown in FIG. 14 that is formed from an array of differential capacitors 212 is that the impact of manufacturing variations is not exacerbated at the high end of the capacitor's tuning range (as with designs of the type described in connection with FIGS. 10-12). This is because the amount of capacitance variation in array 240 remains constant for all of the differential elements in the array.

Consider, for comparison, the previously described situation in which the expected process-induced variation when manufacturing a small capacitor is 0.02 fF. In this type of scenario, the expected variation in capacitance when fabricating the 1.0 fF capacitor ($C_B$) in capacitor 212 might be 0.02 fF (for one standard deviation σ). The expected variation for the 1.5 fF capacitor might therefore be about 0.024 fF (scaling with the square root of the magnitude of the capacitance). The total expected capacitance variation, taking into account possible variations in both $C_A$ and $C_B$, will be 0.03 fF (for one standard deviation σ). With a three-sigma design, deviations of up to three sigma (e.g., 0.09 fF) must be tolerated. Because 0.09 fF is less than the capacitance step size of 0.5 fF in array 240, this type of manufacturing variation may be well tolerated. In the illustrative arrangement of FIGS. 15-17, in comparison, capacitance tuning operations that involved capacitors at the top of the capacitor's tuning range (e.g., capacitors C99 and C100) were subject to three sigma capacitance variations on the order of 0.6 fF, which was larger than the 0.5 fF capacitance step size in array 200 of FIG. 9.

Figure 18:
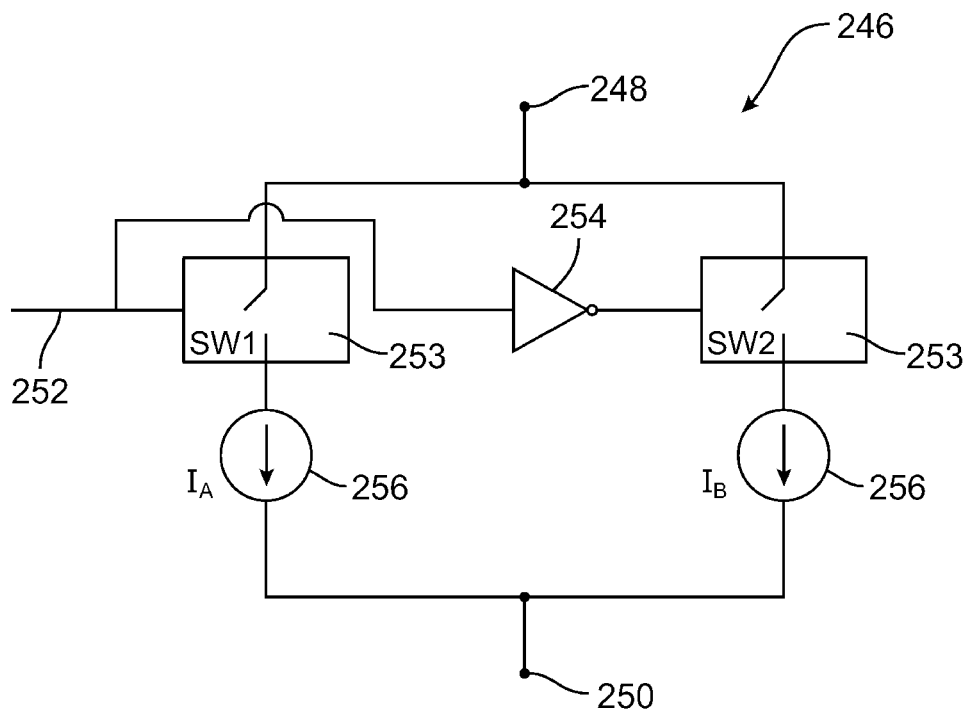
FIG. 18 is a circuit diagram of an illustrative differential current source that may be used in an array of differential current sources in accordance with an embodiment of the present invention.

If desired, adjustable components may be formed from arrays of other differential circuit elements. As an example, an adjustable current source may be formed from an array of differential current sources of the type shown in FIG. 18. As shown in FIG. 18, differential current source 246 may have first terminal 248 and second terminal 250. The amount of current that flows between terminals 248 and 250 may be adjusted by switching one of current sources 256 into place using switches 253. As with the differential capacitor arrangement of FIG. 13, current source 246 may include an inverter 254 that inverts the control signal presented on control input 252 before this signal is used in controlling one of switches 253. This causes switches 253 to be activated out of phase with each other.

Current sources 256 have different strengths $I_A$ and $I_B$ (e.g., with $I_A > I_B$). When switch SW1 is closed, switch SW2 is open and current source $I_A$ is electrically connected between terminals 248 and 250 while current source $I_B$ is disconnected. When switch SW1 is open, switch SW2 is closed and current source $I_B$ is switched into use rather than current source $I_A$. The arrangement of FIG. 18 therefore allows current source 246 to be adjusted between two settings. When the control signal on control input 252 has one value (e.g., a logic high), current source 246 produces current $I_A$, whereas when the control signal on control input 252 has another value (e.g., a logic low), current source 246 produces current $I_B$.

Figure 19:
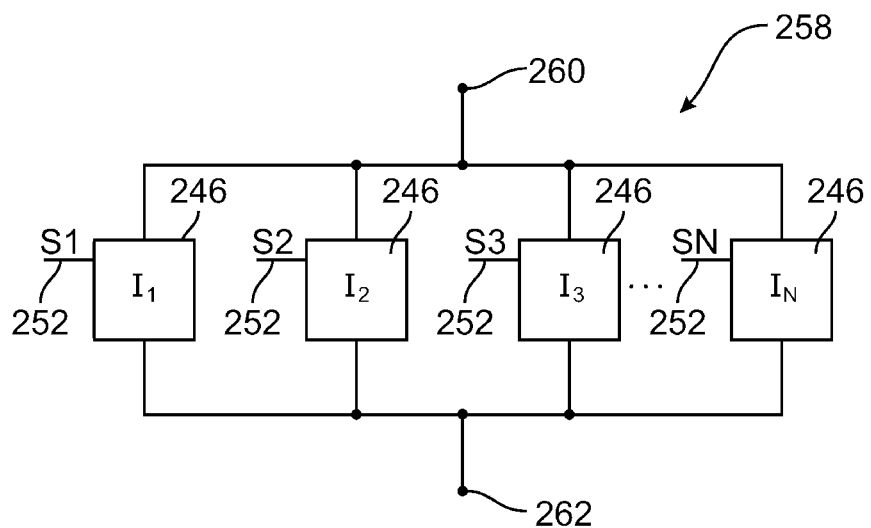
FIG. 19 is a circuit diagram of an illustrative adjustable current source formed from an array of differential current sources of the type shown in FIG. 18 in accordance with an embodiment of the present invention.

An illustrative adjustable current source 258 that has been formed from an array of differential current sources such as differential current source 246 of FIG. 18 is shown in FIG. 19. As shown in FIG. 19, current source 258 may have a first terminal 260 and a second terminal 262. The amount of current that flows between terminals 260 and 262 may be controlled by adjusting the digital control signal S (S1, S2, S3, ... SN) that is applied to control terminals 252 of switches 253 (FIG. 18). Signal S may be provided in any suitable format. For example, signal S may be provided in thermometer code. Each current source 246 in adjustable current source array 258 that receives a high logic control signal at its input 252 will produce a high output current ($I_A$), whereas each current source 246 in adjustable current source array 258 that receives a low logic control signal at its input 252 will produce a low output current ($I_B$). Current sources 246 are connected in parallel, so the currents from current sources 246 collectively form the current flowing between current source terminals 260 and 262. Current sources such as current sources 246 may be used in circuitry such as digital-to-analog converter circuitry (as an example).

Adjustable components such the adjustable capacitor of FIG. 14 and the adjustable current source of FIG. 19 may be less affected by systematic processing variations than adjustable components such as the adjustable capacitor of FIG. 9. This is because arrangements of the type shown in FIG. 9 rely on components of successively increasing strength, whereas arrangements of the type shown in FIGS. 14 and 19 may use components that all have the same strength. In capacitors, the sizes of capacitor electrodes may be adjusted to adjust the magnitude of the capacitances that are produced. In current source arrays, the sizes of structures such as metal-oxide-semiconductor transistor gates (e.g., gate widths) may be adjusted to adjust the magnitudes of the currents that are produced.

Figure 20:
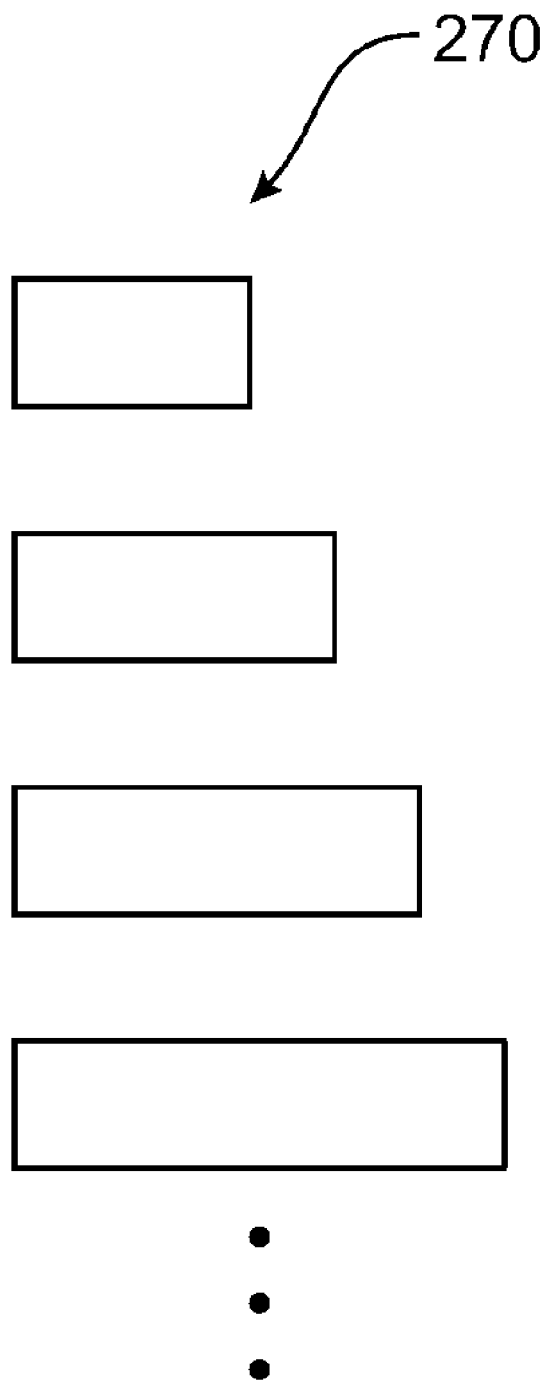
FIG. 20 is a diagram showing the sizes of illustrative circuit structures in an array of circuit elements controlled by a control signal encoded using a one-hot encoding scheme in accordance with an embodiment of the present invention.

Illustrative device structures 270 (e.g., capacitor electrodes, current source transistor gates, etc.) that may be used in an adjustable device such as adjustable capacitor 200 of FIG. 9 are shown in FIG. 20. As shown in FIG. 20, the increasing strength of each device (e.g., the increasing capacitances C1, C2, C3, ... CN of FIG. 9) may be implemented by forming structures 270 (e.g., capacitor electrodes) of successively increasing size.

Figure 21:
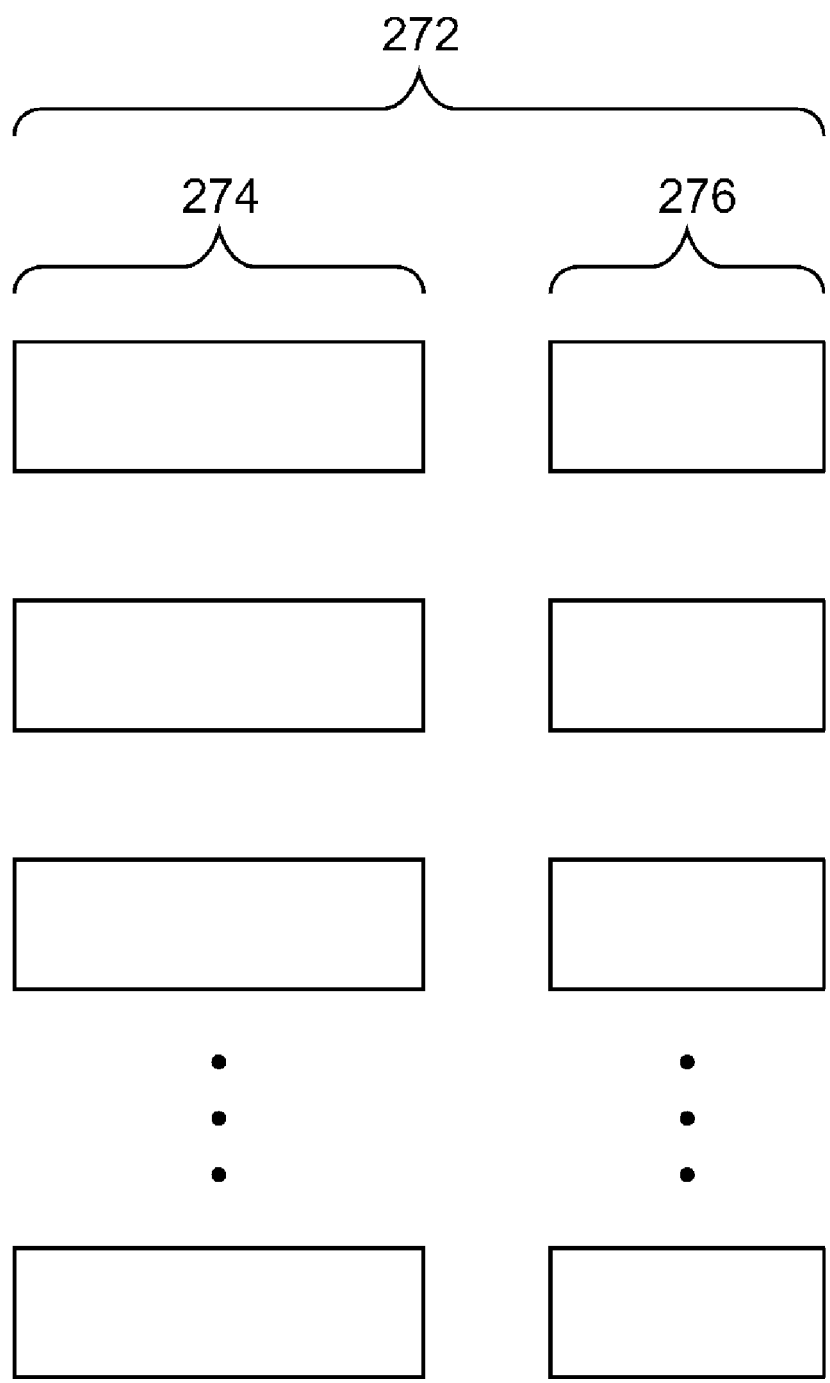
FIG. 21 is a diagram showing the sizes of illustrative circuit structures in an array of circuit elements controlled by a control signal encoded using a thermometer code encoding scheme in accordance with an embodiment of the present invention.

Illustrative device structures 272 (e.g., capacitor electrodes, current source transistor gates, etc.) that may be used in adjustable devices such as adjustable capacitor 240 of FIG. 14 and adjustable current source 258 of FIG. 19 are shown in FIG. 21. Structures 272 may include larger structures 274 and smaller structures 276. Structures 274 may be, for example, electrodes for capacitors $C_A$ of FIGS. 13 and 14 or transistor gates for current source transistors in current sources $I_A$ in current sources 246 (FIGS. 18 and 19). Structures 276 may be, for example, electrodes for capacitors $C_B$ of FIGS. 13 and 14 or transistor gates for current source transistors in current sources $I_B$ in current sources 246 (FIGS. 18 and 19).

Devices formed from structures of the type shown in FIG. 21 tend to be less dependent on systematic variations during device fabrication than devices formed from structures of the type shown in FIG. 20, because the device structures of FIG. 21 each have the same size and shape regardless of which differential they are associated with. In contrast, the device structures of FIG. 20 change with each array element.

Adjustable circuit components such as the adjustable capacitor of FIG. 14 and the adjustable current source of FIG. 19 are formed from arrays of differential circuit elements and may be controlled by control signals that have been encoded using thermometer code. These adjustable circuit components may therefore sometimes be referred to as thermo-delta circuit components. An advantage of thermo-delta circuit components is that these components may offer small step sizes (e.g., small steps of capacitance, current, etc.) without incurring the potential process variation issues associated with constructing large elements (e.g., large capacitors such as capacitor C100 in the example of FIG. 9).

Thermo-delta circuit arrays also tend to exhibit smaller transients than arrays of elements of the type shown in FIG. 9. During operation of arrays of either type, digital control signals such as digital control word S change as a function of time. In arrangements of the type shown in FIG. 9, the digital control word might change from a first state in which capacitor C99 is being switched into use to a second state in which capacitor C100 is being switched into use (as an example). There might be a slight skew (e.g., 1 ns) between the control signals for the switch associated with C99 and the switch associated with C100. This could lead to a 1 ns overlap condition in which both switches 206 are on (erroneously). This, in turn, could lead to a momentary capacitance for capacitor 200 of over 100 fF (i.e., nearly twice the desired amount). Moreover, the skew could give rise to a 1 ns gap in which the C100 switch is turned off prematurely, before the switch for C99 is turned on. This may lead to a momentary drop in the capacitance for capacitor 200 from 51 fF to 0 fF, followed by an abrupt increase to 50.5 fF. Significant undesired changes in capacitance such as these may lead to errors.

In thermo-delta arrangements of the type shown in FIGS. 14 and 19, in contrast, the effects of control signal skew tend to have less impact on device performance. For example, a 1 ns skew when adjusting one of the control bits in control word S to increase the capacitance for capacitor 240 of FIG. 14 by one capacitance step might result in a 1.0 fF capacitor turning off before turning on a 1.5 fF capacitor. In this type of situation, the capacitance of capacitor 240 might fall from 10 fF to 9 fF (for 1 ns) before settling at 10.5 fF as desired (as an example). Although the capacitance value was erroneous for 1 ns, the magnitude of the error (e.g., 1 fF) is less severe than in the FIG. 9 arrangement (where it was approximately 50 times as severe). Dynamic control errors due to control signal skew therefore tend to be more benign in their impact on circuit performance in thermo-delta arrangements than in adjustable array arrangements of the type shown in FIG. 9.

Figure 22:
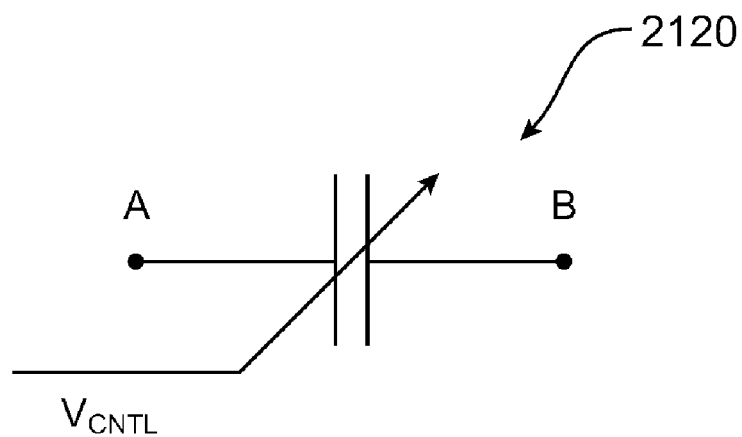
FIG. 22 is a diagram of an illustrative varactor that may be used in adjustable capacitors in accordance with embodiments of the present invention.
Figure 23:
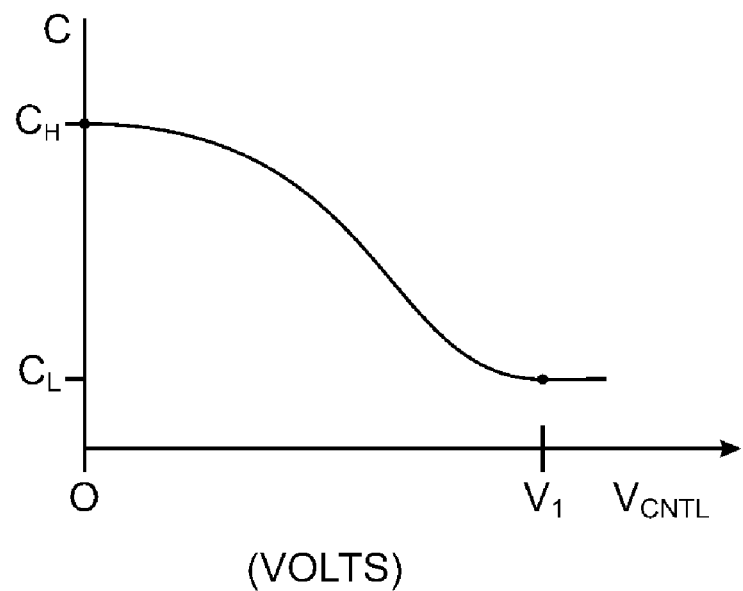
FIG. 23 is an illustrative capacitance versus control voltage characteristic for a varactor of the type shown in FIG. 22.

If desired, adjustable capacitors may be formed from arrays of varactors. An illustrative varactor is shown in FIG. 22. As shown in FIG. 22, varactor 2120 may have a first terminal (terminal A) and a second terminal (terminal B) across which a capacitance C is produced. Varactor 2120 may also have a control terminal that receives a control signal Vcntl. The capacitance C that is exhibited by varactor 2120 varies as a function of the control signal Vcntl (i.e., by increasing or decreasing as a function of increases in the magnitude of Vcntl). With one suitable arrangement, which is shown in FIG. 23 as an example, the capacitance C of varactor 2120 decreases as the value of Vcntl increase. When, for example, the magnitude of Vcntl is 0 volts, the capacitance C is at a maximum value of $C_H$. When the magnitude of Vcntl is $V_1$, the capacitance C is at a minimum value of $C_L$. In a digital control scheme, the control voltage Vcntl may have either a logic high value (e.g., $V_1$) or a logic low value (e.g., 0 volts). Varactor 2120 may be implemented using any suitable structures (e.g., p-n junctions, metal-oxide-semiconductor transistor capacitor structures, etc.).

Varactors such as varactor 2120 may be used in forming a delta capacitor or a thermo-delta capacitor.

For example, in a delta capacitor arrangement of the type shown in FIG. 9, each switch 206 and its associated capacitor 210 in adjustable capacitor 200 may be replaced by a respective varactor 2120. The control terminal of the varactor may receive a corresponding digital control signal (e.g., S1, S2, . . . SN). Terminals A and B may be connected between node 202 and ground 204. The strengths of each of the varactors in this type of an arrangement may vary depending on their position within the array (as described in connection with capacitors C1, . . . CN of FIG. 9).

In an adjustable capacitor of the type shown in FIG. 14, each of the differential capacitors 212 may be formed by a varactor 2120. In this type of arrangement, the control signals on lines 224 may be applied to the varactors as control signals Vcntl. Each varactor 2120 in this type of arrangement may have the same strength (e.g., each varactor 2120 may produce the same $C_L$ and $C_H$ values).

Parasitic capacitances are generally smaller in the switches in thermodelta capacitor arrangements than in the switches in delta capacitor arrangements, because required switch sizes are generally proportional to the sizes of the capacitors they are switching (i.e., the switch required for switching a 50 fF capacitor will generally be about 50 times larger than a switch for switching a 1 fF capacitor). As an example, an adjustable capacitor 200 of the type shown in FIG. 9 might have capacitors 210 with an average capacitance of 25 fF. In this situation, switches 206 will (on average) have a size capable of handling 25 fF capacitor switching. In comparison, 100 thermodelta capacitors (e.g., as shown in FIGS. 13 and 14) might have a fixed size of 2.5 fF (i.e., ten times smaller), thereby reducing the amount of area required for capacitor switching.

Figure 24:
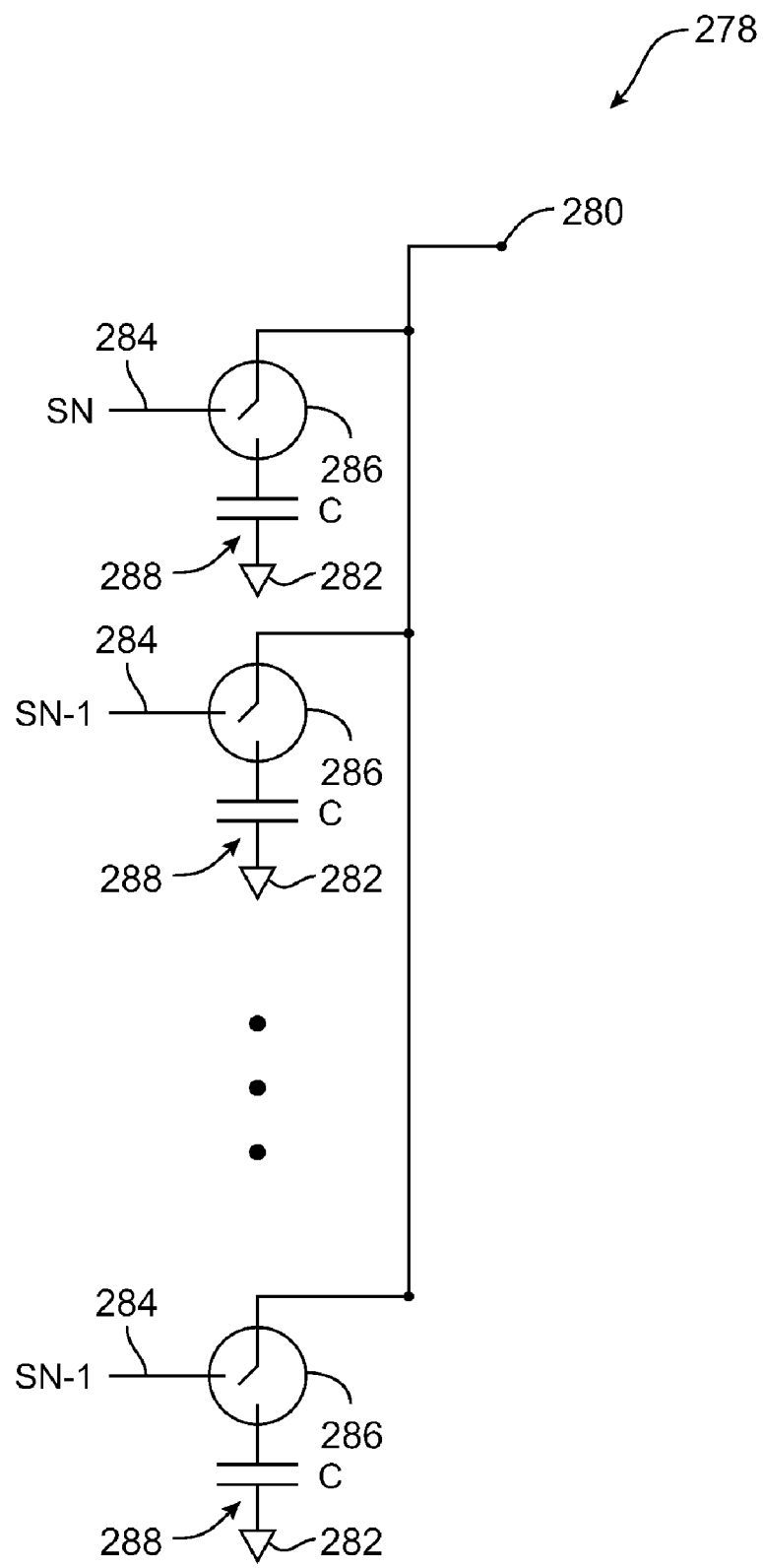
FIG. 24 is a diagram of an illustrative adjustable capacitor with equally sized capacitors that may be controlled by a thermometer code control signal in accordance with an embodiment of the present invention.

FIG. 24 is a diagram of an illustrative adjustable capacitor 278. Adjustable capacitor 278 may be adjusted by controlling a digital control signal (digital control word) on a digital control input made up of lines 284. The control signals on lines 284 may be encoded in thermometer code. Each bit of the control signal on lines 284 may be provided to an equally sized controllable capacitor element. Each controllable capacitor element may be made up of a single adjustable capacitor. With one suitable arrangement, which is shown in FIG. 24, each controllable capacitor element may be formed from a switch 286 that is connected in series with a respective capacitor 288.

The adjustable capacitor 278 of FIG. 24 may provide an adjustable amount of capacitance between terminal 280 and terminal 288. In the FIG. 24 example, node 282 is connected to ground, but in general nodes 280 and 282 may be connected between any two terminals in a circuit (e.g., at the outputs of inverters in a ring oscillator, etc.).

Switches 286 may be turned on and off based on the value of the signal applied at each switch's control input line 284. For example, each switch 286 may be turned off when a low (logic zero) control signal is applied and may be turned on when a high (logic one) control signal is applied. Each capacitor 288 may have an equal capacitance value C. With this type of scheme, the capacitance exhibited by adjustable capacitor 278 will scale linearly with the number of "1s" in the thermometer code that is being applied to the control input made up of lines 284. Capacitors of the type shown in FIG. 24 are sometimes referred to as "pure" thermometer code adjustable capacitors.

Figure 25:
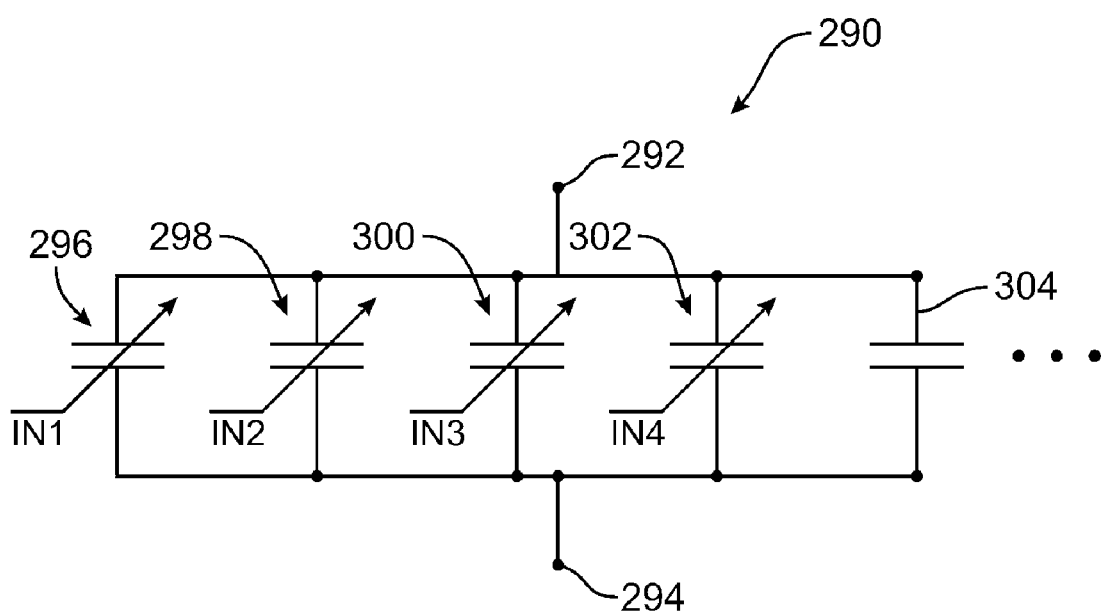
FIG. 25 is a diagram showing how capacitors of different types may be combined in accordance with an embodiment of the present invention.

In some circuits, the adjustable capacitors of the present invention may be used in combination with other capacitances. For example, the capacitance of adjustable capacitor 240 of FIG. 14 may represent only part of the overall adjustable capacitance in a given circuit. An example of a capacitor that is formed from multiple capacitors of different types that have been connected in parallel is shown in FIG. 25. In the example of FIG. 25, capacitor 290 exhibits an adjustable amount of capacitance between terminals 292 and 294. Capacitors such as capacitor 290 may include one or more adjustable capacitors such as capacitors 296, 298, 300, and 302. These capacitors may receive single-bit or multi-bit digital control signals or analog control signals, shown as control signals IN1, IN2, IN3, and IN4. Capacitors 296, 298, 300, and 302 may be of the same type or some or all of these capacitors may be of different types. As an example, capacitor 296 may be a capacitor of the type shown in FIG. 9, capacitor 298 may be a capacitor of the type shown in FIG. 14, capacitor 300 may be a capacitor of the type shown in FIG. 24, and capacitor 302 may be an analog varactor. If desired, fixed capacitors such as capacitor 304 may be connected in parallel with one or more of these capacitors. One or more of these capacitors may also be connected in series.

Figure 26:
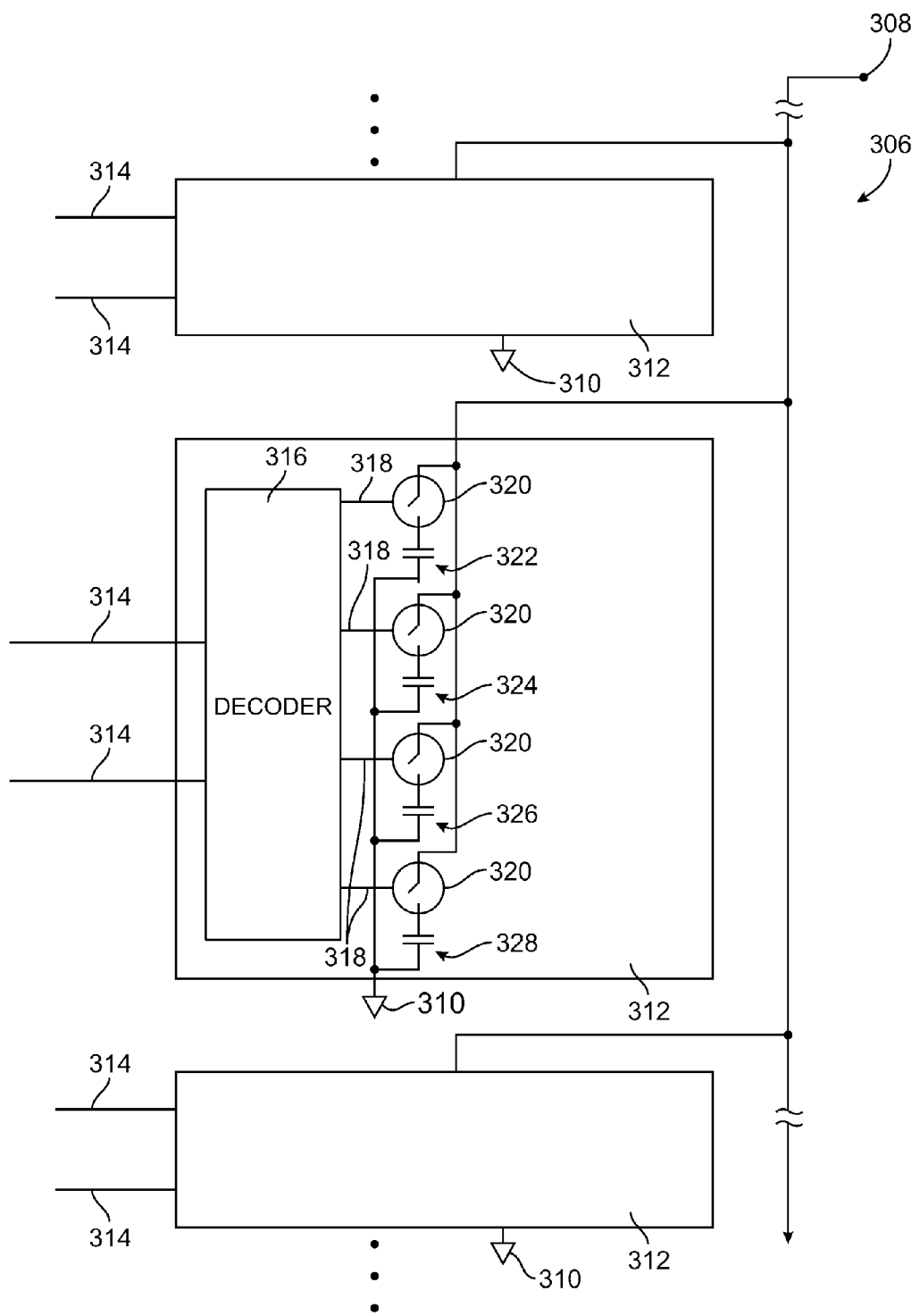
FIG. 26 is a diagram of an adjustable capacitor made up of multiple adjustable capacitors each of which is controlled by a multi-bit control signal in accordance with an embodiment of the present invention.

Hybrid capacitors that are based on more than one capacitor type may also be used as stand-alone adjustable capacitors or as adjustable capacitors in a capacitor such as capacitor 290 of FIG. 25. An illustrative hybrid capacitor arrangement is shown in FIG. 26. As shown in FIG. 26, capacitor 306 may be used to produce an adjustable amount of capacitance between terminals 308 and 310. Terminal 310 is shown as being connected to ground in FIG. 26, but may, in general, be connected to any suitable circuit node.

Capacitor 306 may include an array of multi-bit adjustable capacitors 312 (also sometimes referred to as capacitor cells). Each adjustable capacitor 312 may have associated control input lines 314 that make up a multi-bit digital control input. In a typical arrangement, each capacitor 312 in the array of capacitor 306 has identical components. Only the components of the central capacitor 312 are shown in FIG. 26 to avoid over-complicating the drawing.

Each capacitor 312 may have an optional decoder 316. Decoders 316 may convert signals on input lines 314 to a different encoding scheme. For example, signals may be presented on the input lines 314 of each cell 312 in binary-encoded format (within that cell) and may be output onto lines 318 as a corresponding one-hot encoded signal (within that cell). If desired, decoder 316 may be omitted, provided that control signals in the desired format are provided to lines 314 (i.e., in one-hot encoding). The one-hot encoding scheme that is used on lines 318 in the FIG. 26 example applies only to the particular capacitor 312 that is being controlled and does not span multiple cells (i.e., the signals on the lines 318 in one cell 312 include one high value, the signals on the lines 318 in the next cell 312 also include one high value, etc.).

Lines 318 may convey the control signals on lines 318 to respective controllable capacitor elements. In the example of FIG. 26, each controllable capacitor element includes a switch 320 and an associated capacitor 322. When a given switch 320 receives a logic low signal on its associated control input 318, that switch will be turned off and its associated capacitor 322 will not be connected to node 308. When a given switch 320 receives a logic high signal on its control input 318, the switch will be turned on and its associated capacitor 322 will be connected between node 310 and node 308.

Because a one-hot encoding scheme is used on lines 318 in each capacitor 312, only one of capacitors 322, 324, 326, and 328 in a given capacitor 312 will be switched into use at a given time. To provide adjustable capacitor 312 with a range of possible capacitance values, capacitors 328, 326, 324, and 322 may each be provided with a capacitance value that differs by a fixed amount (i.e., a constant delta) from the next, as described in connection with the capacitor of FIG. 9. For example, capacitor 328 may be provided with a 1 fF capacitance, capacitor 326 may be provided with a 1.5 fF capacitance, capacitor 324 may be provided with a 2.0 fF capacitance, and capacitor 322 may be provided with a 2.5 fF capacitance. This scheme allows a desired capacitance value from 1 fF to 2.5 fF to be produced by each capacitor 312.

Within each capacitor 312, a one-hot encoding scheme is used for the control signal that controls switches 320 and therefore selection of the total capacitance value for that capacitor 312. The overall encoding scheme for capacitor 306 may use a thermometer code arrangement. When it is desired to produce a minimum amount of capacitance with capacitor 306, all of the capacitors 312 may be set to produce their minimum capacitance (e.g., 1 fF). In this situation, the array of cells 312 all are set to low ("0") states. When it is desired to produce a maximum amount of capacitance with capacitor 306, all of capacitors 312 may be adjusted so that they produce their maximum capacitance (e.g., 2.5 fF). In this situation, the array of cells 312 are all set to high ("1") states.

When intermediate values of capacitance are desired, none or some of the capacitors 312 in one portion of array 306 (e.g., the lower portion of array 306) are each set to produce their maximum capacitance, none or some of the capacitors in another portion of array 306 (e.g., at the top portion of array 306) are each set to produce their minimum capacitance, and a single capacitor cell 312 that lies between these two groups of capacitors is set to a desired setting. The desired setting for this intermediate capacitor 312 may range from its minimum capacitance to its maximum capacitance (i.e., in the present two-bit example, the desired setting may range from 1 fF to 2.5 fF).

Schemes such as this in which some number of capacitors 312 (i.e., the capacitances at the upper portion of the array of capacitors 312 in adjustable capacitor 306) are set to their minimum ("0") capacitance values and some other number of capacitors are set to higher ("1") values have a thermometer-code-like control scheme, but, within each capacitor 312 are controlled using one-hot encoding on that capacitor's lines 318. As such, these schemes may sometimes be referred to as quasi-thermometer code schemes or thermometer-one-hot encoding schemes. Arrangements in which each capacitor 312 is provided with a binary-to-one-hot decoder such as decoder 316 of FIG. 26 may be controlled by a binary control signal and may be referred to as using thermometer-binary encoding or thermometer-one-hot encoding.

Hybrid capacitors of the type shown in FIG. 26 may be used in combination with other fixed and adjustable capacitors. For example, capacitors such as capacitor 306 may be included as one of the adjustable capacitors in capacitors 290 of FIG. 25. If desired, capacitors may be formed that use arrays of different types of elements. For example, an array may be formed in which adjustable capacitor cells based on capacitors of the type shown in FIG. 9 are interspersed with adjustable capacitor cells based on capacitors of the type shown in FIG. 14. The digital control word used in this type of scheme may include a mixture of thermometer code portions (for controlling the FIG. 14 capacitor portions) and one-hot code portions (for controlling the FIG. 9 capacitor portions).

The one-hot encoded portions may be produced by decoding a portion of a thermometer code control word that is provided to the input of an adjustable capacitor cell (as shown by cells 312 of FIG. 26) or may be received from other circuits on an integrated circuit. The portion of each digital control word that is applied to the capacitor cells based on the FIG. 14 arrangement in this type of situation will not overlap with each other and will not all be contiguous. Similarly, the one-hot portions of the digital control word will be non-overlapping and will not all be contiguous. In schemes in which a single type of coding is used, each portion of the signal that corresponds to a respective capacitor cell (e.g., each single-bit or multi-bit capacitor cell control signal) will generally be contiguous and non-overlapping within the control word.

The foregoing is merely illustrative of the principles of this invention and various modifications can be made by those skilled in the art without departing from the scope and spirit of the invention.

What is claimed is:

1. An adjustable circuit component controllable by a multi-bit thermometer code control signal, comprising:
an array of multiple differential circuit elements, each of the differential circuit elements having a control input that is operable to receive at least one respective bit of the multi-bit thermometer code control signal, wherein each differential circuit element comprises a first terminal, a first capacitor, a second capacitor, and switching circuitry responsive to the at least one bit associated with that differential circuit element and operable to, in a first mode, connect the first capacitor directly to the first terminal of that differential circuit element and isolate the second capacitor from the first terminal of that differential circuit element and operable to, in a second mode, connect the second capacitor directly to the first terminal of that differential circuit element and isolate the first capacitor from the first terminal of that differential circuit element.

2. The adjustable circuit component defined in claim 1 wherein each of the at least one bits forms a respective part of a digital control word.

3. The adjustable circuit component defined in claim 1 wherein each of the at least one bits forms a non-overlapping part of a digital control word.

4. The adjustable circuit component defined in claim 1 wherein the first and second capacitors of each differential circuit element have different capacitances.

5. The adjustable circuit component defined in claim 4 wherein the switching circuitry is operable enter the first mode when the bit of thermometer code control signal received at the control input of that differential capacitor has a first value and to enter the second mode when the bit of thermometer code control signal received at the control input of that differential capacitor has a second value.

6. The adjustable circuit component defined in claim 5 wherein the switching circuitry in each differential capacitor comprises a first switch connected to the first capacitor in that differential capacitor and a second switch connected to the second capacitor in that differential capacitor.

7. The adjustable circuit component defined in claim 6 wherein each differential capacitor comprises an inverter having an input that is connected to the control input of that differential capacitor and having an inverter output, wherein the first switch in each differential capacitor has a first control input that is connected to the control input of that differential capacitor, and wherein the second switch in each differential capacitor has a second control input that is connected to the output of the inverter in that differential capacitor.

8. The adjustable circuit component defined in claim 1 wherein each differential circuit element comprises a second terminal and wherein the first terminals of the differential circuit elements are connected together, wherein the second terminals of the differential circuit elements are connected together.

9. Circuitry on an integrated circuit comprising:
an adjustable capacitor having a first terminal and a second terminal, wherein the adjustable capacitor is operable to produce an adjustable capacitance between the first and second terminals in response to a multi-bit thermometer code control signal, wherein the adjustable capacitor comprises a plurality of capacitors coupled in parallel between the first and second terminals; and
a circuit coupled to the first terminal, wherein the circuit is adjustable by adjusting the adjustable capacitor with the multi-bit thermometer code control signal and wherein the plurality of capacitors comprises a plurality of differential capacitors, wherein each differential capacitor comprises a capacitor terminal, a first capacitor element, a second capacitor element, and switching circuitry responsive to at least one respective bit of the multi-bit thermometer code control signal and operable to, in a first mode, connect the first capacitor element directly to the capacitor terminal of that differential circuit element and isolate the second capacitor element from the capacitor terminal of that differential circuit element and operable to, in a second mode, connect the second capacitor element directly to the capacitor terminal of that differential circuit element and isolate the first capacitor element from the capacitor terminal of that differential circuit element.

10. The circuitry defined in claim 9, wherein, in each differential capacitor, a first switch and the first capacitor element are coupled together in series and a second switch and the second capacitor element are coupled together in series, forming pluralities of first switches, second switches, first capacitor elements, and second capacitor elements respectively.

11. The circuitry defined in claim 10 wherein each first capacitor element of the plurality of first capacitor elements has a first common capacitance value and wherein each second capacitor element of the plurality of second capacitor elements has a second common capacitance value that is different from the first common capacitor value.

12. The circuitry defined in claim 11 wherein each switch of the pluralities of first and second switches is operable to receive a respective bit of the control signal.

13. The circuitry defined in claim 9 wherein the circuit is coupled to the first terminal, wherein the circuit comprises a ring oscillator having at least one inverter, wherein the inverter has an output coupled to the first terminal.

14. The circuitry defined in claim 9 wherein the first capacitor elements each have the same capacitance.

15. The circuitry defined in claim 13 wherein the second capacitor elements each have a common capacitance value.

16. The circuitry defined in claim 15 wherein each differential capacitor comprises an inverter having an inverter input and an inverter output, wherein in each of the differential capacitors:
a first switch has a first control input;
a second switch has a second control input;
the inverter input for that differential capacitor is operable to receive the respective bit of the multi-bit thermometer code control signal;
the first control input is operable to receive the respective bit of the multi-bit thermometer code control signal; and
the second control input is operable to receive an inverted version of the respective bit from the inverter output.

17. The circuitry defined in claim 16 wherein the circuit coupled to the first terminal comprises a ring oscillator.

18. The circuitry defined in claim 17 wherein the ring oscillator comprises an inverter having an output coupled to the first terminal.

19. The circuitry defined in claim 16 wherein the circuit coupled to the first terminal comprises a phase-locked loop circuit.

20. A method of controlling a capacitance produced by an adjustable capacitor with a control input, comprising:
applying a thermometer code control signal to the control input to adjust the capacitance, wherein the adjustable capacitor is formed from an array of differential capacitors each of which has a respective control line and wherein applying the thermometer code control signal comprises applying respective bits of the thermometer code control signal to the respective control lines, wherein each differential capacitor comprises a terminal, a first capacitor element, a second capacitor element, and switching circuitry responsive to at least one bit of the thermometer code control signal that is associated with that differential capacitor and operable to, in a first mode, connect the first capacitor element directly to the terminal of that differential circuit element and isolate the second capacitor element from the terminal of that differential circuit element and operable to, in a second mode, connect the second capacitor element directly to the terminal of that differential circuit element and isolate the first capacitor element from the terminal of that differential circuit element.

21. The method defined in claim 20 wherein the adjustable capacitor is connected to an inverter output node in a ring oscillator and wherein applying the thermometer code control signal comprises adjusting a frequency of oscillation of the ring oscillator by adjusting the capacitance.

22. Circuitry on an integrated circuit comprising:
an adjustable capacitor having a first adjustable capacitor terminal and a second adjustable capacitor terminal, wherein the adjustable capacitor is operable to produce an adjustable capacitance between the first adjustable capacitor terminal and the second adjustable capacitor terminal in response to a multi-bit thermometer code control signal, wherein the adjustable capacitor comprises a plurality of differential capacitors each having a first capacitor terminal connected to the second adjustable capacitor terminal, wherein each differential capacitor comprises a first capacitor, a second capacitor, a first switch, and a second switch, wherein each of the first switches is directly connected in series between the first adjustable capacitor terminal and a respective one of the first capacitors, and wherein each of the second switches is directly connected in series between the first adjustable capacitor terminal and a respective one of the second capacitors;
a circuit connected to one of the adjustable capacitor terminals that is adjusted by adjusting the adjustable capacitor with the control signal; and
circuitry responsive to at least one bit of the multi-bit thermometer code control signal and operable to, in a first mode, generate signals that close at least a given one of the first switches and that open at least a given one of the second switches and operable to, in a second mode, generate signals that open at least the given one of the first switches and that close at least the given one of the second switches.

23. The circuitry defined in claim 22 wherein each of the plurality of capacitors has a different capacitance.

24. The circuitry defined in claim 22 wherein the differential capacitors form an array of multi-bit adjustable capacitor elements.

* * * * *